United States Patent
Wen et al.

(10) Patent No.: US 10,574,212 B2
(45) Date of Patent: Feb. 25, 2020

(54) METHOD AND CIRCUIT FOR LOW-NOISE REFERENCE SIGNAL GENERATION

(71) Applicant: MEDIATEK Inc., Hsin-Chu (TW)

(72) Inventors: Sung-Han Wen, Hsin-Chu (TW); Chuan-Hung Hsiao, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/163,625

(22) Filed: Oct. 18, 2018

(65) Prior Publication Data

US 2019/0158065 A1     May 23, 2019

Related U.S. Application Data

(60) Provisional application No. 62/589,019, filed on Nov. 21, 2017.

(51) Int. Cl.
    *H03H 11/04*     (2006.01)
    *H03L 7/093*     (2006.01)
    (Continued)

(52) U.S. Cl.
    CPC ............... *H03H 11/04* (2013.01); *G05F 3/20* (2013.01); *H03L 7/093* (2013.01); *G05F 3/262* (2013.01); *G05F 3/30* (2013.01)

(58) Field of Classification Search
    CPC .................................................... H03H 11/04
    (Continued)

(56) References Cited

U.S. PATENT DOCUMENTS

| | | | |
|---|---|---|---|
| 5,572,162 A | 11/1996 | Cotreau | |
| 6,208,206 B1 * | 3/2001 | Leung | H03F 1/086 330/100 |

(Continued)

FOREIGN PATENT DOCUMENTS

| | | |
|---|---|---|
| EP | 2086111 A2 | 8/2009 |
| EP | 2639666 A1 | 9/2013 |

(Continued)

OTHER PUBLICATIONS

EP Search Report dated Mar. 20, 2019 in EP application (No. 18207538.2-1203).

(Continued)

*Primary Examiner* — Tomi Skibinski
(74) *Attorney, Agent, or Firm* — McClure, Qualey & Rodack, LLP

(57) ABSTRACT

A circuit for low-noise reference signal generation comprising a filter unit and a functional unit. The filter unit comprises a transistor and an energy storage component. The transistor comprises a first node, a second node, a control node and a body node. The first node is configured to receive an input signal. The second node is configured to output a filtered signal. The control node is configured to receive a control signal for controlling the transistor to turn on or off. The body node is configured to couple to the input signal, the output signal or a signal which is similar to the input signal or the output signal. The energy storage component is coupled to the second node of the transistor. The functional unit is coupled to the second node of the transistor and the energy storage component. The functional unit has high input impedance.

18 Claims, 8 Drawing Sheets

(51) Int. Cl.
*G05F 3/20* (2006.01)
*G05F 3/26* (2006.01)
*G05F 3/30* (2006.01)

(58) Field of Classification Search
USPC ........ 327/538, 558, 553–555, 308, 310, 311, 327/313, 328
See application file for complete search history.

(56) References Cited

U.S. PATENT DOCUMENTS

| | | |
|---|---|---|
| 7,218,170 B1 | 5/2007 | Carter et al. |
| 2003/0197549 A1 | 10/2003 | Rasmussen et al. |
| 2013/0234688 A1 | 9/2013 | Sakaguchi |
| 2016/0173072 A1* | 6/2016 | Taghivand ........... H03H 11/245 327/321 |

FOREIGN PATENT DOCUMENTS

| | | |
|---|---|---|
| EP | 3026816 A1 | 6/2016 |
| TW | 201631835 A | 9/2016 |
| WO | 2016093991 A1 | 6/2016 |

OTHER PUBLICATIONS

TIPO Office Action dated Mar. 28, 2019 in Taiwan application (No. 107141078).

* cited by examiner

US 10,574,212 B2

METHOD AND CIRCUIT FOR LOW-NOISE REFERENCE SIGNAL GENERATION

This application claims the benefit of U.S. provisional application Ser. No. 62/589,019, filed Nov. 21, 2017, the subject matter of which is incorporated herein by reference.

BACKGROUND OF THE INVENTION

Field of the Invention

The invention relates in general to method and circuit for reference signal generation, and more particular to method and circuit for low-noise signal reference generation.

Description of the Related Art

In various kinds of circuitry, there is a need to generate reference voltages or reference currents. For example, circuitry of earbuds may include one or more digital to analog converters (DAC), and the inputs of the DACs may be provided by one or more circuits which generate reference signals (e.g., reference currents or reference voltages). In this case, the noise of the reference signals may affect the quality of the output audio. In other words, if the noise of the reference noise can be reduced, the quality of the output audio can be improved. Therefore, how to generate low-noise reference signals has always been a goal of the industry.

SUMMARY OF THE INVENTION

An aspect of the present invention discloses a circuit for low-noise reference signal generation comprising a filter unit and a functional unit. The filter unit comprises a transistor and an energy storage component. The transistor comprises a first node, a second node, a control node and a body node. The first node is configured to receive an input signal. The second node is configured to output a filtered signal. The control node is configured to receive a control signal for controlling the transistor to turn on or off. The body node is configured to couple to the input signal, the output signal or a signal which is similar to the input signal or the output signal. The energy storage component is coupled to the second node of the transistor. The functional unit is coupled to the second node of the transistor and the energy storage component. The functional unit has high input impedance.

Another aspect of the present invention discloses a circuit for low-noise reference signal generation comprising a filter unit, an input unit and a functional unit. The filter unit comprises a transistor and an energy storage component. The transistor comprises a first node, a second node, a control node and a body node. The first node is configured to receive an input signal. The second node is configured to output a filtered signal. The control node is configured to receive a control signal for controlling the transistor to turn on or off. The body node is configured to couple to the input signal, the output signal or a signal which is similar to the input signal or the output signal. The energy storage component is coupled to the second node of the transistor. The functional unit is coupled to the second node of the transistor and the energy storage component. The input unit is coupled to the first node of the transistor. The input unit is a current to voltage converting circuit. The functional unit is a voltage to current converting circuit which has high input impedance.

Yet another aspect of the present invention discloses a method for low-noise reference signal generation, comprising: providing a circuit which includes a filter unit and a functional unit, wherein the filter unit includes a transistor and an energy storage component, the transistor is configured to receive an input signal and output a filtered signal, a body node of the transistor is coupled to the input signal, the filtered signal or a signal which is similar to the input signal or the filtered signal, and the functional unit has high input impedance; controlling the transistor, by a control signal, to turn on for charging the energy storage component; and controlling the transistor, by the control signal, to turn off to cause the filter unit to be configured as a low pass filter.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
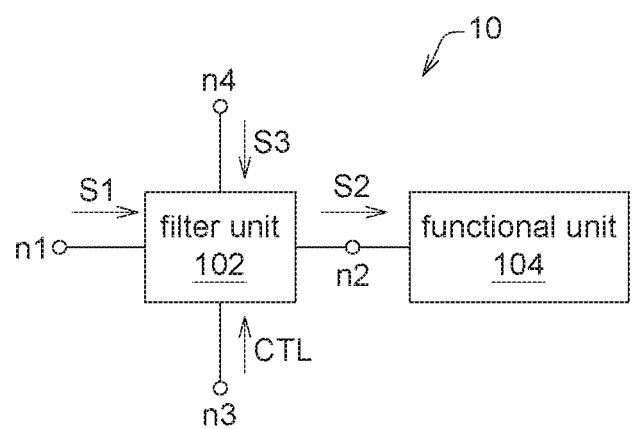
FIG. 1 shows a block diagram of a circuit for low-noise reference signal generation according to an embodiment of the present invention.

Referring to FIG. 1, FIG. 1 shows a block diagram of a circuit for low-noise reference signal generation according to an embodiment of the present invention. The circuit 10 includes a filter unit 102 and a functional unit 104. The filter unit 102 includes a transistor M and an energy storage component E. The transistor M may be a NMOS or a PMOS. The transistor M includes a first node n1, a second node n2, a control node n3 and a body node n4. The first node n1 of the transistor M is configured to couple to a circuit providing an input signal S1. The input signal S1 may be a voltage signal. The second node n2 of the transistor M is coupled to the energy storage component E, for providing a filtered signal S2. The control node n3 of the transistor M is configured to receive a control signal CTL, and the transistor M is controlled by the control signal CTL to turn on/off. The body node n4 of the transistor M is configured to receive a tracking signal S3. The tracking signal S3 may be the input signal S1, the filtered signal S2 or a signal, which is similar to the input signal S1 or the filtered signal S2. The functional unit 104 may be a circuit having high input impedance, e.g. >10G, which means that the impedance seen by the filter unit 102 is high enough so that the leakage current from the functional unit (or functional circuit) 104 to the filter unit 102 equals to zero or approaches zero. In the embodiment, when the transistor M is turned off by the control signal CTL, the transistor M is equivalent to a resistor having high resistance (e.g., >100MΩ), and the filter unit 102 may act as a RC filter with a resistor having high resistance. Details may be illustrated with referring to a practical example shown in FIG. 2A.

Figure 2A:
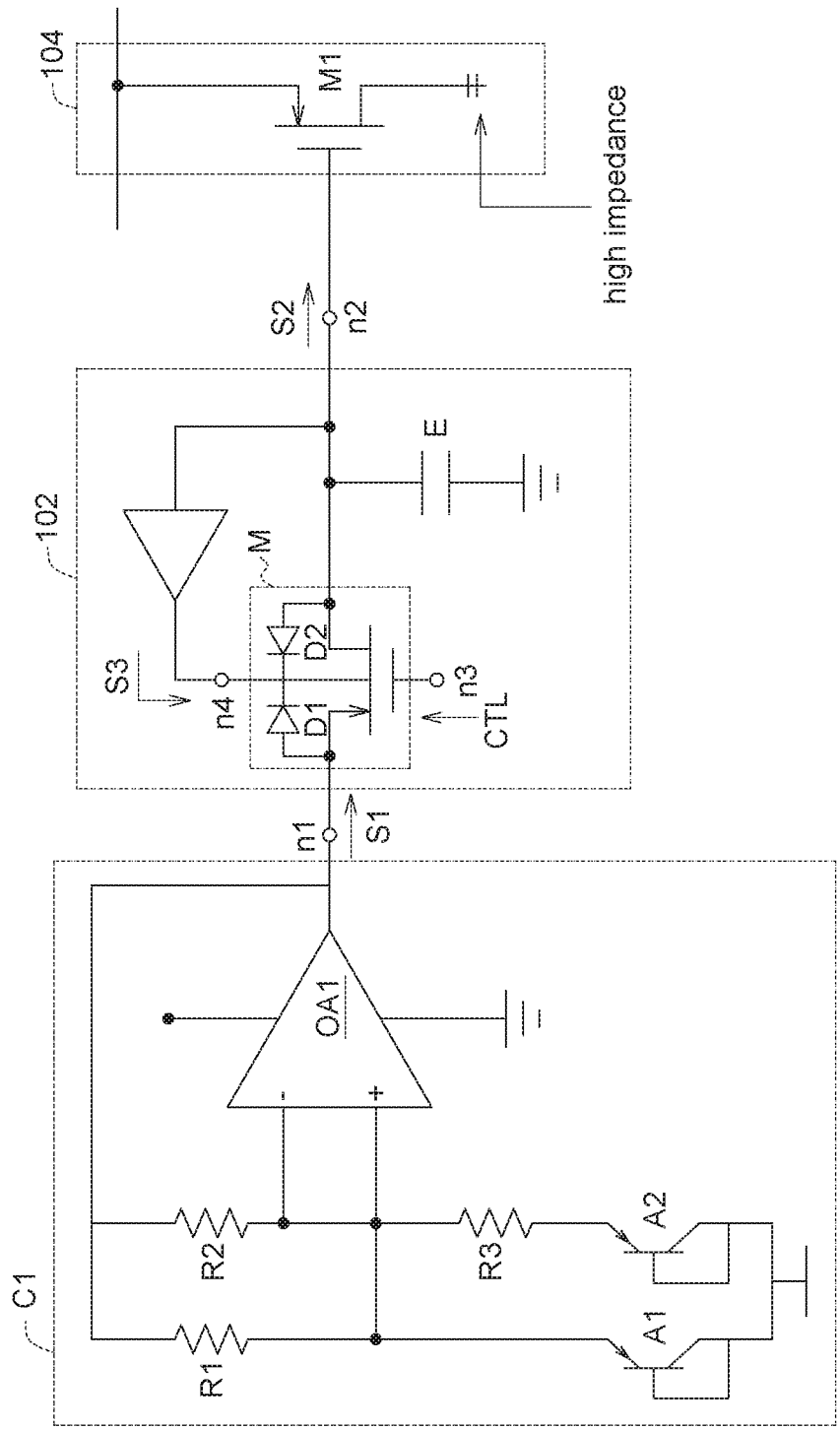
FIG. 2A shows a practical example of a circuit for low-noise reference signal generation according to an embodiment of the present invention.
Figure 2B:
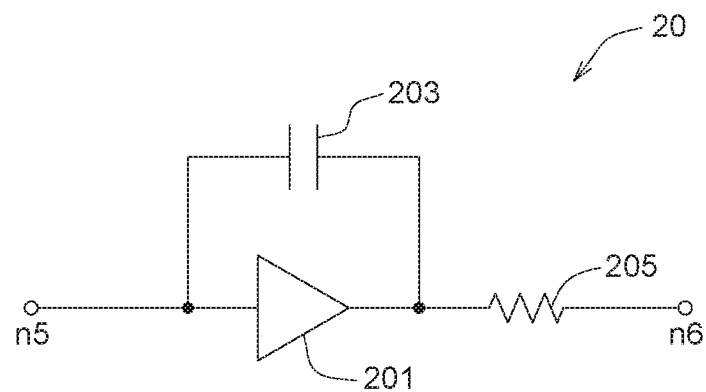
FIG. 2B shows an example of a damping circuit for implementing the energy storage component.
Figure 2C:
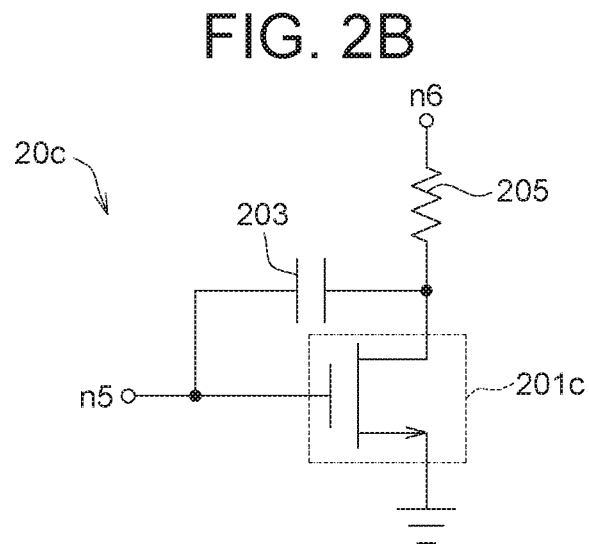
FIGS. 2C and 2D show two circuit examples for implementing the operation amplifier of the damping circuit in FIG. 2B.
Figure 2D:
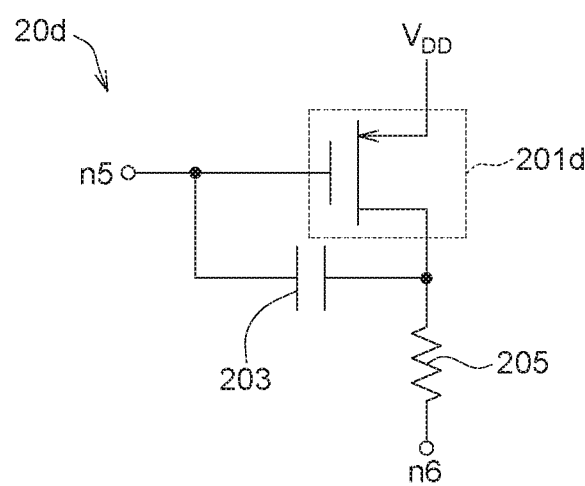

FIG. 2A shows a practical example of a circuit for low-noise reference signal generation according to an embodiment of the present invention. In this example, the transistor M is a PMOS, and the energy storage component E can be a MIM (Metal-Insulator-Metal) capacitor, a MOM (Metal-Oxide-Metal) capacitor a MOS capacitor, a MOS varactor (passive capacitor) or a damping circuit (active capacitor). The filtered signal S2 is coupled to the body node n4 of the transistor M by an operational amplifier as the tracking signal S3. D1 and D2 are junction diodes of the transistor M. The functional unit 104 includes a transistor M1 which is a PMOS. The input signal is provided by a circuit C1 which includes an operational amplifier OA1, a number of resistors R1~R3 and a number of transistors A1, A2. The output voltage of the operational amplifier OA1 is input to the filter unit 102 as the input signal S1. To be mentioned, FIG. 2B shows a damping circuit which is utilized for implementing the energy storage component E. The damping circuit 20 includes an operational amplifier 201, a capacitor 203 and a resistor 205. An input node n5 of the operational amplifier 201 is configured to couple to the second node 112 of the transistor M. One node of the capacitor 203 is coupled to the input node of the operational amplifier 201, and the other node of the capacitor 203 is coupled to an output node of the operational amplifier 201. One node of the resistor 205 is coupled to the output node of the operational amplifier 201, and the other node n6 of the resistor 205 is configured to couple to ground, a supply or a reference voltage. Further, the operational amplifier 201 of the damping circuit 20 may be implemented in various ways. FIGS. 2C and 2D show two circuit examples for implementing the operation amplifier 201. In FIG. 2C, the operational amplifier of the damping circuit 201c is implemented by a NMOS 201c. In FIG. 2D, the operational amplifier of the damping circuit 201d is implemented by a PMOS 201d.

Figure 3:
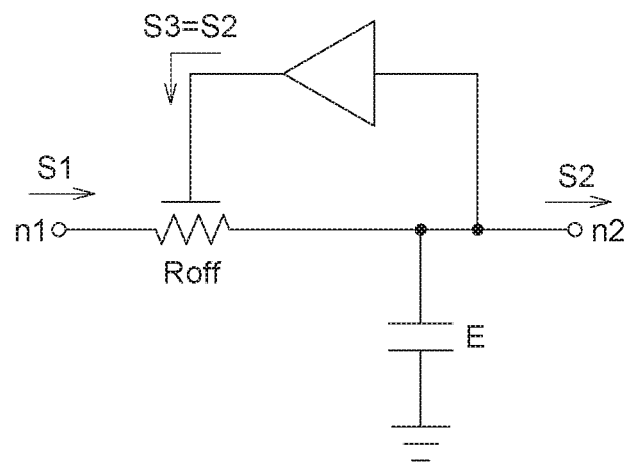
FIG. 3 shows an equivalent circuit of the filter unit when the transistor is turned off.

In the embodiment shown in FIG. 2A, the equivalent circuit of the filter unit 102 when the transistor M of the filter unit 102 is turned off by the control signal CTL is shown in FIG. 3. As shown in FIG. 3, the transistor M is equivalent to a resistor Roff, which has high resistance. That is, the filter unit (or filter circuit) 102 is configured as a low pass filter. By the filter unit 102 being configured as a low pass filter, the 3 dB frequency of the spectrum of the noise can be adjusted to be lower than an interested band (e.g., 20 Hz~20 kHz). In other words, the energy of the noise within the interested band is reduced. Therefore, it is considered that the input signal S1 is "cleaned" by the filter unit 102, and the filtered signal S2 is generated as a low-noise signal to provide to the functional circuit 104.

To be mentioned, since the filtered signal S2 is coupled to the body node n4 of the transistor M, it is possible to avoid generation of leakage current when the transistor M is turned off.

When the transistor M is turned on by the control signal CTL, the filter unit 102 is configured as an all pass filter. The input signal S1 can pass through the transistor M and charge the energy storage component E.

Figure 7A:
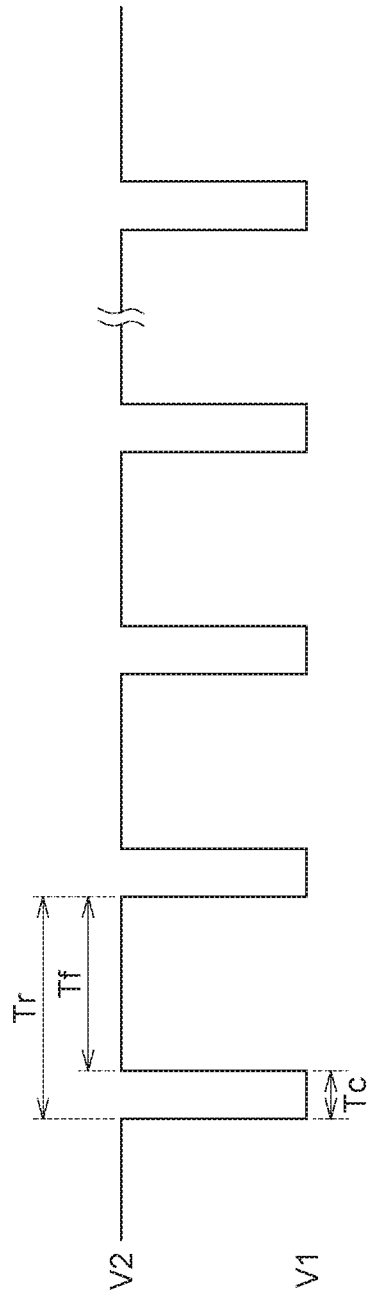
FIGS. 7A-7C show scheme diagrams of control signals for controlling a filter unit according to an embodiment of the present invention.
Figure 7B:
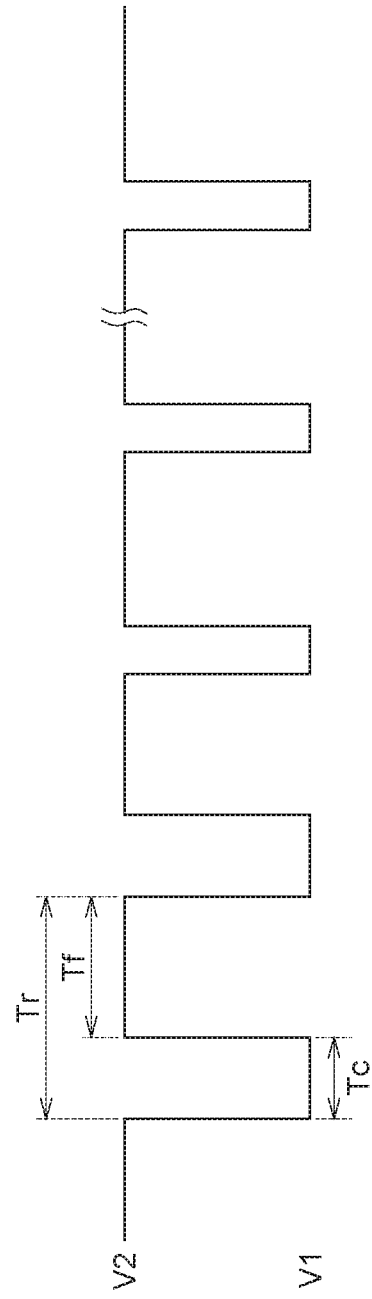
Figure 7C:
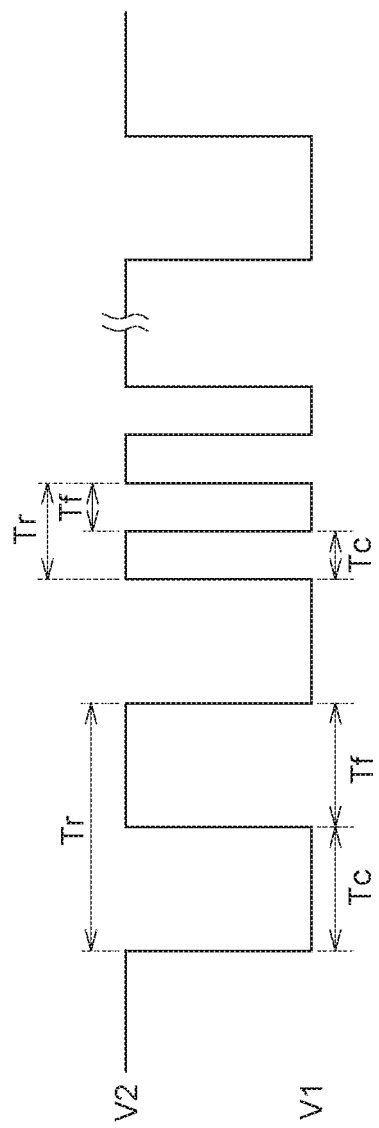

The control signal can be either a digital signal or an analog signal. In an embodiment, as shown in FIG. 7A, the control signal CTL may be a PWM (pulse width modulation) with regular pulse. In a single period Tr of the control signal CTL, the control signal CTL is a first voltage level V1 in time interval Tc, and the control signal CTL is a second voltage level V2 in time interval Tf. When the transistor M is a PMOS, the transistor M may be turned on during time interval Tc, and the transistor M may be turned off during time interval Tf. In a digital case, the first voltage level V1 may be zero and the second voltage V2 may be VDD, but, in an analog case, the first voltage level V1 may have a voltage level higher than zero. That is, the energy storage component E may be charged during time interval Tc (i.e., the time interval may also refer to a "charging time"), and the filter unit 102 may configured as an all pass filter. In the other hand, the filter unit 102 may be configured as a low pass filter during the time interval Tf. In another embodiment, as shown in FIG. 7B, the control signal is a PWM signal with irregular pulse. In this embodiment, the time intervals Tc and Tf are not fixed. For example, the time interval Tc can be made longer during initial operation of the circuit 10. As the running time gets longer, the time interval Tc can be reduced. In yet another embodiment, as shown in FIG. 70, the control signal CTL may be a PFM (pulse frequency modulation) signal. That is, in this embodiment, the time of a single period Tr of the control signal CTL is not fixed. In an embodiment, the ratio of the first time interval and a single period Tr of the control signal CTL is larger than 100 (i.e., Tc/Tr>100). In another embodiment, the ratio of the charging time in a single period and the single period is a random variable.

The above embodiments are for a case that the transistor M is a PMOS. In a case that the transistor M is a NMOS, the first voltage level V1 of the control signal CTL in the charging time may be lower than VDD.

Figure 4:
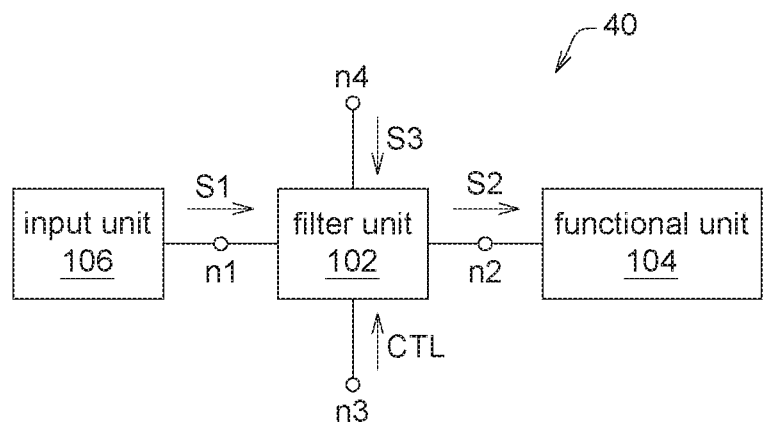
FIG. 4 shows a block diagram of a circuit for low-noise reference signal generation according to another embodiment of the present invention.

Referring to FIG. 4, FIG. 4 shows a block diagram of a circuit for low-noise reference signal generation according to another embodiment of the present invention. The circuit 40 is similar to the circuit 10, but the circuit 40 further includes an input unit 106. In this embodiment, the input unit 106 is a current to voltage (IN) converting circuit, and the functional unit 104 is a voltage to current (V/I) converting circuit. Since the operations and functions of the filter unit 102 is the same as the embodiment described above, it may not be repeated herein.

Figure 5A:
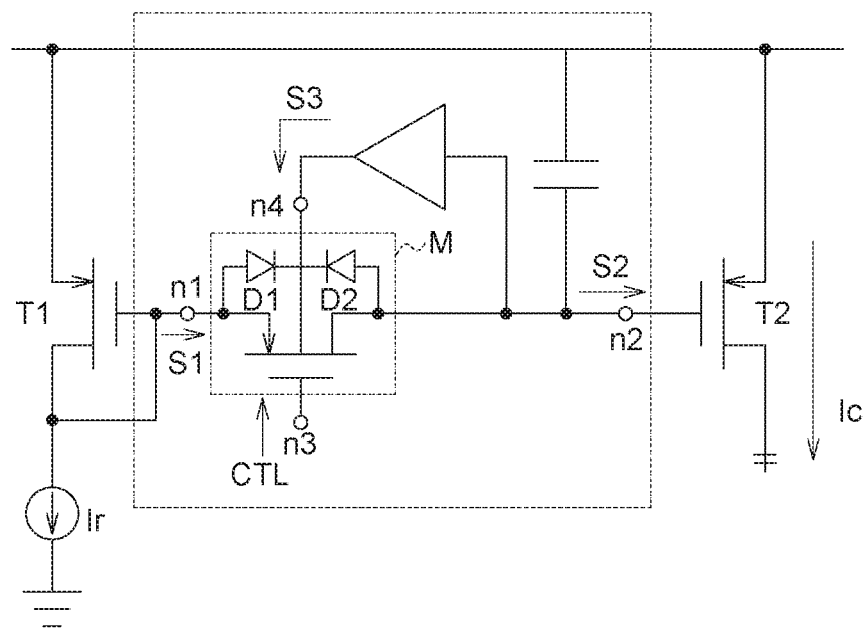
FIGS. 5A and 5B show practical examples of a circuit for low-noise reference signal generation according to another embodiment of the present invention.
Figure 5B:
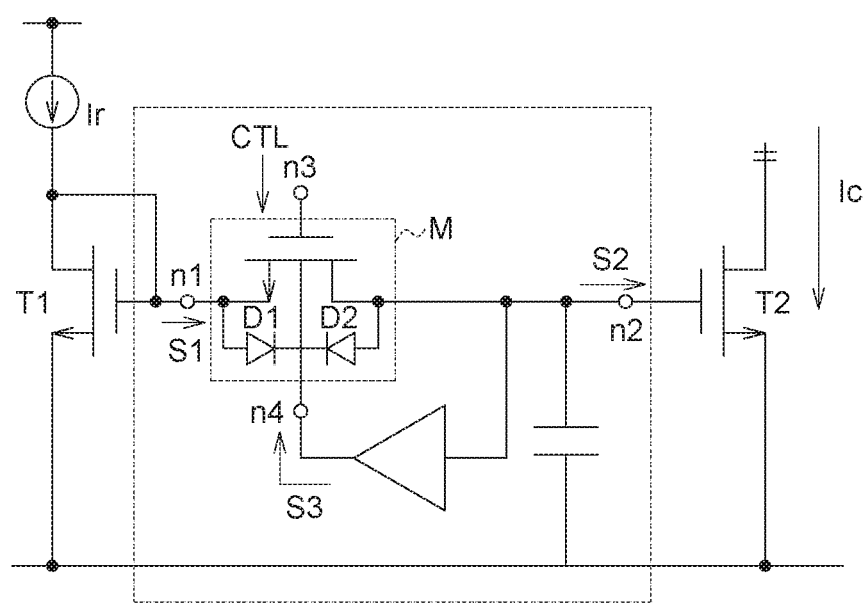

FIG. 5A shows a practical example of a circuit for low-noise reference signal generation according to another embodiment of the present invention. The input unit 106 includes a current source Ir and a transistor T1. The current source Ir generates a noisy reference current, and the transistor T1 converts the noisy reference current to a noisy voltage signal as the input signal S1. The filter unit 102 filters the noise of the input signal S1 and then output the filtered signal S2. The functional unit 104 includes a transistor T2. The transistor T2 receives the filtered signal S2 and converts the filtered signal S2 to a clean reference current Ic. In another practical example in FIG. 5B, the transistor M of the filter unit 102, the transistor T1 of the input unit 106 and the transistor T2 of the functional unit 104 are NMOS. Noted that, in some cases, the type of the transistors may be different. For example, the transistor M of the filter unit 102 is PMOS, and the transistor T1 of the input unit 106 and the transistor T2 of the functional unit 104 are NMOS.

Figure 6:
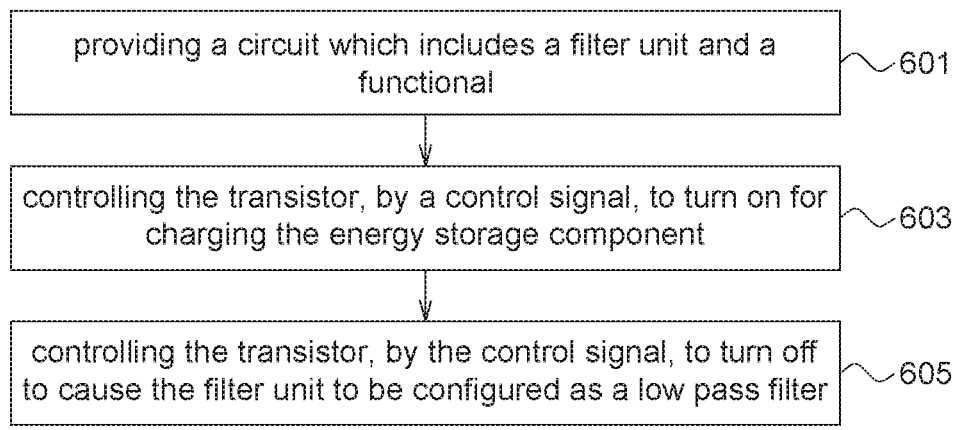
FIG. 6 shows a flowchart of a method for low-noise reference signal generation according to an embodiment of the present invention.

FIG. 6 shows a flowchart of a method for low-noise reference signal generation according to an embodiment of the present invention.

In step 601, providing a circuit which includes a filter unit and a functional unit is performed. The filter unit includes a transistor and an energy storage component. The transistor is configured to receive an input signal and output a filtered signal. A body node of the transistor is coupled to the input signal, the filtered signal or a signal which is similar to the input signal or the filtered signal. The functional unit has high input impedance.

In step 603, controlling the transistor, by a control signal, to turn on for charging the energy storage component is performed. In this step, the filter unit is configured as an all pass filter.

In step 605, controlling the transistor, by the control signal, to turn off to cause the filter unit to be configured as a low pass filter is performed.

Steps 603 and 605 may be performed repeatedly during the runtime of the circuit.

In an embodiment, the control signal is a PWM signal or a PFM signal. When the control signal is a PWM signal, the ratio of a charging time in a single period and the single period may be either fixed or not fixed, wherein the charging time refers to the time interval that the control signal is in a state of first voltage level to turn the transistor on. In an embodiment, the charging time can be made longer during initial operation of the circuit. As the running time gets longer, the charging time can be reduced. In an embodiment, the ratio of the charging time in a single period and the single period is larger than 100. In an embodiment, the ratio of the charging time in a single period and the single period is a random variable.

With the present invention, a noisy reference signal which is either a reference voltage or a reference current can be cleaned, and a clean reference signal may be produced, within an interested band, for example, 20 Hz~20 kHz in audio use. That is, with the present, the noise of the noisy reference signal within the interest band can be reduced.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A circuit for low-noise reference signal generation, comprising:
   a filter unit, comprising a transistor and an energy storage component, wherein the transistor comprises a first node, a second node, a control node and a body node, the first node is configured to receive a input signal, the second node is configured to output a filtered signal, the control node is configured to receive a control signal for controlling the transistor to turn on or off, the body node is configured to couple to the input signal, the output signal or a signal which is similar to the input signal or the output signal, and the energy storage component is coupled to the second node of the transistor;
   a functional unit, coupled to the second node of the transistor and the energy storage component, wherein the functional unit has high input impedance,
   wherein the control signal is a PWM signal with regular pulse, a PWM signal with irregular pulse or a PFM signal, and
   when the control signal is in a state of a first voltage level, the transistor is turned on, the energy storage component is charged via the transistor, and the filter unit is configured as an all pass filter; when the control signal is in a state of a second voltage level, the transistor is turned off, and the filter unit is configured as a low pass filter, and the transistor is equivalent a resistor of the low pass filter.

2. The circuit according to claim 1, wherein the ratio of the time of the control signal in the state of the first voltage level in a single period of the control signal and the single period of the control signal is a random variable.

3. The circuit according to claim 1, wherein the ratio of the time of the control signal in the state of the first voltage level in a single period of the control signal and the single period of the control signal is larger than 100.

4. The circuit according to claim 1, wherein the time of the control signal in the state of the first voltage level in a single period of the control signal is made longer during initial operation of the circuit.

5. The circuit according to claim 1, wherein the energy storage component includes a MIM (Metal-Insulator-Metal) capacitor, a MOM (Metal-Oxide-Metal) capacitor, a MOS capacitor or a MOS varactor.

6. The circuit according to claim 1, wherein the energy storage component includes a damping circuit, including at least one transistor and a capacitor.

7. The circuit according to claim 6, wherein the input node of the damping circuit in the energy storage component is coupled to the second node of the transistor in the filter unit.

8. A circuit for low-noise reference signal generation, comprising:
   a filter unit, comprising a transistor and an energy storage component, wherein the transistor comprises a first node, a second node, a control node and a body node, the first node is configured to receive a input signal, the second node is configured to output a filtered signal, the control node is configured to receive a control signal for controlling the transistor to turn on or off, the body node is configured to couple to the input signal, the output signal or a signal which is similar to the input signal or the output signal, and the energy storage component is coupled to the second node of the transistor;
   an input unit, coupled to the first node of the transistor, wherein the input unit is a current to voltage converting circuit; and
   a functional unit, coupled to the second node of the transistor and the energy storage component, wherein the functional unit is a voltage to current converting circuit which has high input impedance,
   wherein the control signal is a PWM signal with regular pulse, a PWM signal with irregular pulse or a PFM signal, and
   when the control signal is in a state of a first voltage level, the transistor is turned on, the energy storage component is charged via the transistor, and the filter unit is configured as an all pass filter; when the control signal is in a state of a second voltage level, the transistor is turned off, and the filter unit is configured as a low pass filter, and the transistor is equivalent a resistor of the low pass filter.

9. The circuit according to claim 8, wherein the ratio of the time of the control signal in the state of the first voltage level in a single period of the control signal and the single period of the control signal is a random variable.

10. The circuit according to claim 8, wherein the ratio of the time of the control signal in the state of the first voltage level in a single period of the control signal and the single period of the control signal is larger than 100.

11. The circuit according to claim 8, wherein the time of the control signal in the state of the first voltage level in a single period of the control signal is made longer during initial operation of the circuit.

12. The circuit according to claim 8, wherein the energy storage component includes a MIM (Metal-Insulator-Metal) capacitor, a MOM (Metal-Oxide-Metal) capacitor, a MOS capacitor or a MOS varactor.

13. The circuit according to claim 8, wherein the energy storage component includes a damping circuit, including at least one transistor and a capacitor.

14. The circuit according to claim 13, wherein the input node of the damping circuit in the energy storage component is coupled to the second node of the transistor in the filter unit.

15. A method for low-noise reference signal generation, comprising:

providing a circuit which includes a filter unit and a functional unit, wherein the filter unit includes a transistor and an energy storage component, the transistor is configured to receive an input signal and output a filtered signal, a body node of the transistor is coupled to the input signal, the filtered signal or a signal which is similar to the input signal or the filtered signal, and the functional unit has high input impedance;

controlling the transistor, by a control signal, to turn on for charging the energy storage component; and controlling the transistor, by the control signal, to turn off to cause the filter unit to be configured as a low pass filter, wherein the control signal is a PWM signal with regular pulse, a PWM signal with irregular pulse or a PFM signal, and when the control signal is in a state of a first voltage level, the transistor is turned on, the energy storage component is charged via the transistor, and the filter unit is configured as an all pass filter; when the control signal is in a state of a second voltage level, the transistor is turned off, and the filter unit is configured as a low pass filter, and the transistor is equivalent a resistor of the low pass filter.

16. The method according to claim 15, wherein the ratio of the time of the control signal in the state of the first voltage level in a single period of the control signal and the single period of the control signal is a random variable.

17. The method according to claim 15, wherein the ratio of the time of the control signal in the state of the first voltage level in a single period of the control signal and the single period of the control signal is larger than 100.

18. The method according to claim 15, wherein the time of the control signal in the state of the first voltage level in a single period of the control signal is made longer during initial operation of the circuit.

* * * * *